United States Patent
Honda et al.

(10) Patent No.: US 9,678,166 B2
(45) Date of Patent: Jun. 13, 2017

(54) VOLTAGE DETECTION DEVICE

(71) Applicant: DENSO CORPORATION, Kariya, Aichi-pref. (JP)

(72) Inventors: Kazutaka Honda, Chiryu (JP); Tetsuya Makihara, Nukata-gun (JP); Shogo Hikosaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 254 days.

(21) Appl. No.: 14/553,018

(22) Filed: Nov. 25, 2014

(65) Prior Publication Data

US 2015/0153422 A1 Jun. 4, 2015

(30) Foreign Application Priority Data

Nov. 29, 2013 (JP) .................................. 2013-247869

(51) Int. Cl.
- G01N 27/416 (2006.01)
- G01R 31/36 (2006.01)
- G01R 19/165 (2006.01)

(52) U.S. Cl.
CPC .... *G01R 31/3658* (2013.01); *G01R 19/16542* (2013.01)

(58) Field of Classification Search
CPC .................................................. G01R 31/3658
USPC .................................................. 324/426–434
See application file for complete search history.

(56) References Cited

U.S. PATENT DOCUMENTS

| | | | |
|---|---|---|---|
| 7,626,524 B2* | 12/2009 | Horie | H03M 1/1225 327/91 |
| 2008/0094272 A1 | 4/2008 | Horie | |
| 2008/0150516 A1* | 6/2008 | Yonezawa | G01R 19/16542 324/123 R |
| 2011/0234441 A1 | 9/2011 | Makihara et al. | |
| 2012/0139545 A1* | 6/2012 | Makihara | G01R 31/3658 324/426 |

FOREIGN PATENT DOCUMENTS

JP 2012-88106 A 5/2012

OTHER PUBLICATIONS

Office Action issued Nov. 10, 2015 in the corresponding JP application No. 2013-247869 (with English translation).

* cited by examiner

*Primary Examiner* — Robert Grant
*Assistant Examiner* — Sailesh Thapa
(74) *Attorney, Agent, or Firm* — Posz Law Group, PLC

(57) ABSTRACT

A first part circuit and an operational amplifier form a level shift circuit, which selects either one of battery cells forming an assembled battery and extracts and holds a voltage representing an inter-terminal voltage of a selected battery cell. A second part circuit and the operational amplifier form a residual voltage generation circuit, which generates a residual voltage by amplifying a differential voltage between a conversion subject voltage and an analog voltage corresponding to a conversion result of an A/D conversion circuit and applies the residual voltage to the A/D conversion circuit as a conversion subject voltage. A switchover circuit operates the operational amplifier as either one of the level shift circuit and the residual voltage generation circuit and switches over a connection-state to apply a voltage held by the level shift circuit to the A/D conversion circuit and the residual voltage generation circuit as a conversion subject voltage.

8 Claims, 11 Drawing Sheets

VOLTAGE DETECTION DEVICE

CROSS REFERENCE TO RELATED APPLICATION

This application is based on and incorporates herein by reference Japanese patent application No. 2013-247869 filed on Nov. 29, 2013.

FIELD

The present disclosure relates to a voltage detection device, which detects individual inter-terminal voltages of battery cells forming an assembled battery.

BACKGROUND

A hybrid vehicle, an electric vehicle, a note-type personal computer and other devices use assembled batteries. The assembled battery is formed of a plurality of secondary batteries (battery cells) connected in series. It is necessary in such an assembled battery to detect individually a voltage of each battery cell for calculation of capacity of each battery cell and protective management.

A conventional device of this kind (for example, JP-A-2008-145180 corresponding to US 2008/0150516 A1) is formed of an A/D converter and a level shift circuit, which selects either one of battery cells and shifts an inter-terminal voltage of a selected battery cell to be within an input voltage range of the A/D converter.

The level shift circuit is generally formed of an integration circuit, which uses an operational amplifier and a capacitor. Among various types of A/D converters, a cyclic type A/D converter is most suited for size reduction. This cyclic type A/D converter A/D-converts an analog voltage, which is a conversion subject voltage to be converted, by an A/D converter of less number of bits, generates an analog voltage based on an A/D conversion result, generates a residual voltage by subtracting a generated analog voltage from the conversion subject voltage, amplifies the residual voltage and A/D-converts an amplified residual voltage by the A/D converter. A circuit for generating the residual voltage is formed of an integration circuit, which uses an operational amplifier and a capacitor.

Since both circuits include the operational amplifiers, which occupy large circuit areas and consume large electric power, as described above, the circuit area and power consumption of the entire device increases.

SUMMARY

It is therefore an object to reduce a circuit area and power consumption of a voltage detection device.

According to one aspect, a voltage detection device is provided for an assembled battery formed of battery cells connected in series. The voltage detection device comprises an operational amplifier, a first part circuit, an A/D conversion circuit, a second part circuit, a switchover circuit and a control circuit. The first part circuit forms, jointly with the operational amplifier, a level shift circuit, which selects either one of the battery cells of the assembled battery and extracts and holds a voltage representing an inter-terminal voltage of a selected battery cell. The A/D conversion circuit converts an inputted conversion subject voltage to a digital value. The second part circuit forms, jointly with the operational amplifier, a residual voltage circuit, which generates a residual voltage by amplifying a differential voltage between the conversion subject voltage and an analog voltage corresponding to a conversion result of the A/D conversion circuit, and applies the residual voltage to the A/D conversion circuit as the conversion subject voltage. The switchover circuit operates the operational amplifier as either one of the level shift circuit and the residual voltage generation circuit, and switches over a state of connection of the first part circuit and the second part circuit so that a voltage held by the level shift circuit is applied to the A/D conversion circuit and the residual voltage generation circuit as the conversion subject voltage. The control circuit controls setting of the switchover circuit and operations of the first part circuit and the second part circuit so that an operation of a cyclic type A/D converter is performed. The control circuit operates the operational amplifier in a level shift mode to operate as the level shift circuit and then operates the operational amplifier in an A/D conversion mode to operate as the residual voltage generation circuit. The control circuit circulates through the A/D conversion circuit and the residual voltage generation circuit the conversion subject voltage applied from the level shift circuit.

EMBODIMENT

A voltage detection device will be described below with reference to various embodiments shown in the accompanying drawings.

First Embodiment

<Entire Configuration>

Figure 1:
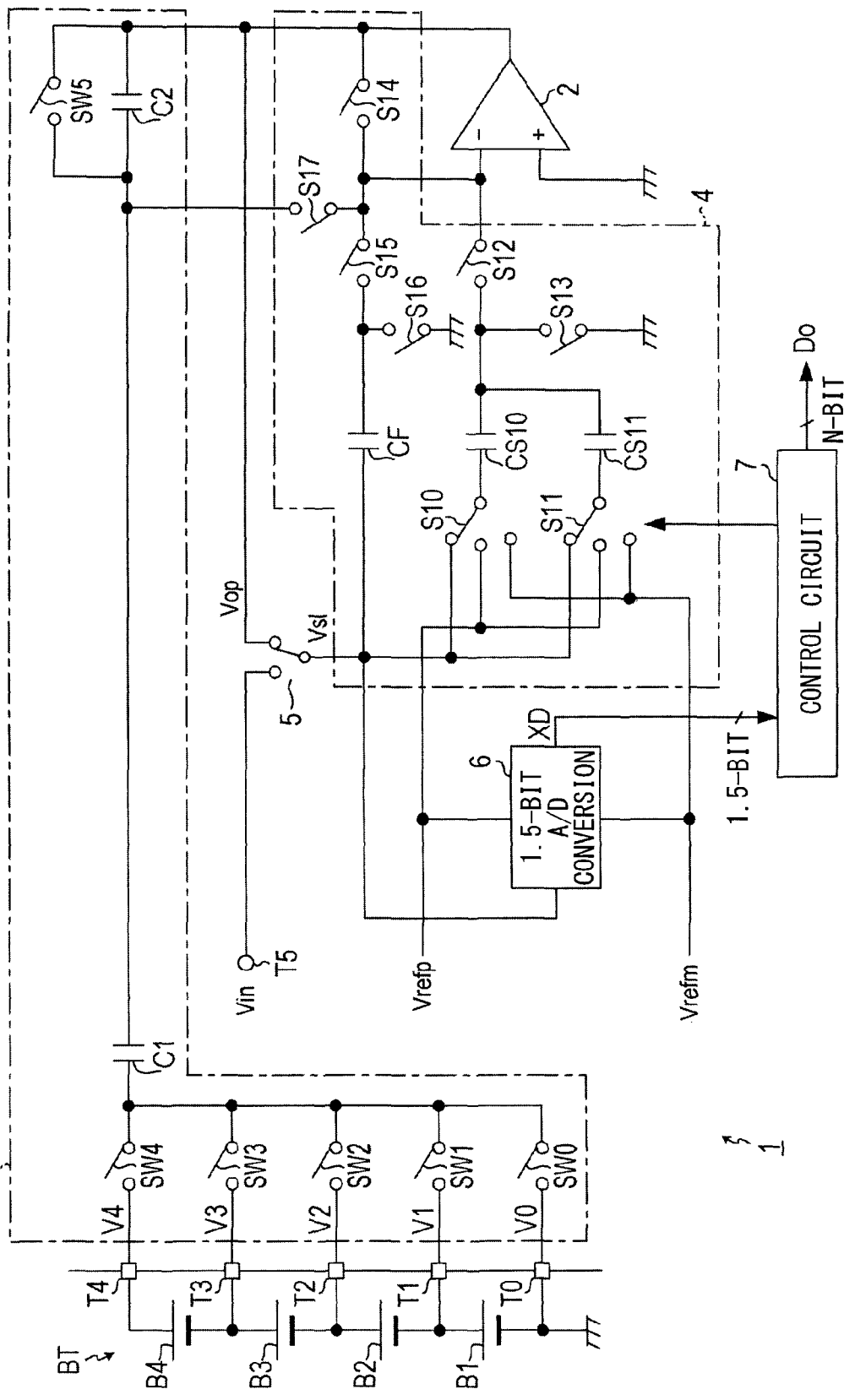
FIG. 1 is a circuit diagram of a voltage detection device according to a first embodiment.

A voltage detection device 1 according to a first embodiment shown in FIG. 1 is applied to an assembled battery BT, which is used as a vehicle-mounted battery or the like. The voltage detection device 1 detects individually an inter-terminal voltage of each battery cell B1 to B4 forming the assemble battery BT and outputs an A/D-converted result. The inter-terminal voltage is a voltage, which equals a difference between terminal voltages of the battery cell.

The voltage detection device 1 includes, an operational amplifier 2, a first part circuit 3, a second part circuit 4, an input switchover circuit 5, an A/D conversion circuit 6 and a control circuit 7. The assembled battery BT is formed of the battery cells B1 to B4, which are secondary batteries (for example lithium-ion batteries) connected in series. It is assumed here that the number of cells is four. The number of cells may be any number equal to two or more. In the following description, a terminal voltage at a positive side (positive-side voltage) and a voltage at a negative side (negative-side voltage) of each battery cell Bi (i=1 to 4) are represented as Vi and Vi−1, respectively.

The voltage detection device 1 receives voltages V0 to V4 of both sides of each battery cell B1 to B4 through terminals T0 to T4. That is, the negative-side voltage V0 of the battery cell B1 is applied to the terminal T0, the negative-side voltage Vj of the battery cell Bj+1 and the positive-side voltage of the battery cell Bj is applied to the terminal Tj (j=1, 2, 3), and the positive-side voltage V4 of the battery cell B4 is applied to the terminal T4.

<First Part Circuit>

The first part circuit 3 forms a level shift circuit jointly with the operational amplifier 2, a non-inverting input terminal of which is connected to a ground line. The level shift circuit selects either one of the battery cells B1 to B4 and shifts a voltage level of a voltage corresponding to an inter-terminal voltage (Vi−Vi−1) of a selected battery cell Bi to a value suited to be in an input voltage range of the A/D conversion circuit 6.

The first part circuit 3 is formed of capacitors C1, C2 and switches SW0 to SW5. The capacitors C1 and C2 are connected in series and one end, which is at the capacitor C2 side, is connected to an output terminal of the operational amplifier 2. The capacitor C2 is interposed between the output terminal and an inverting input terminal of the operational amplifier 2. That is, a common junction between the capacitors C1 and C2 is connectable to the inverting input terminal of the operational amplifier 2.

One ends of the switches SW0 to SW4 are connected in common and a common junction is connected to an end of the capacitor C1 side of the capacitors C1 and C2. Individual terminals of the switches SW0 to SW4, which are opposite to the common junction, are connected to the terminals T0 to T4, respectively. The switch SW5 is connected in parallel with the capacitor C2.

<Input Switchover Circuit>

The input switchover circuit 5 selects either one of an output voltage Vop of the operational amplifier 2 and an external input voltage Vin applied to an external input terminal T5 and applies a selected voltage as a conversion target voltage Vsl, which is to be A/D-converted, to the second part circuit 4 and the A/D conversion circuit 6.

<A/D Conversion Circuit>

The A/D conversion circuit 6 is a 1.5-bit A/D converter, which converts the conversion subject voltage Vsl to a digital conversion value XD of 2 bits, which represents 3 values, by using two threshold voltages Vth1 and Vth2 (<Vth1), which are generated by dividing a differential voltage (Vrefp−Vrefm) between a predetermined high reference voltage Vrefp and a low reference voltage Vrefm. Specifically, the A/D conversion circuit 6 outputs 0 (=00) when Vsl<Vth1, 1 (=01) when Vth1≤Vsl<Vth2, and 2 (=10) when Vsl≥Vth2. The A/D conversion circuit 6 may be a conventional one, which is formed of, for example, voltage dividing resistors, a comparator, a latch circuit, an encoder and the like. The voltage dividing resistors generate the threshold voltages Vth1 and Vth2 from the reference voltages Vrefp and Vrefm. The comparator compares the conversion subject voltage Vsl with the threshold voltages Vth1 and Vth2. The latch circuit latches an output voltage of the comparator. The encoder converts an output voltage of the latch circuit to the digital conversion value XD.

<Second Part Circuit>

The second part circuit 4 forms a residual voltage generation circuit together with the operational amplifier 2 and is formed of a capacitor array circuit, which includes capacitors CS10, CS11, CF and switches S10 to S17.

The residual voltage generation circuit subtracts from the conversion subject voltage Vsl an analog voltage corresponding to the digital conversion value XD, which is the A/D conversion result of the conversion subject voltage Vsl and generates a residual voltage by amplifying this differential voltage. The residual voltage thus generated is the conversion subject voltage Vsl in the next step processing and applied to the A/D conversion circuit 6 and the second part circuit 4 (that is, the residual voltage generation circuit itself). The residual voltage circuit forms a cyclic type A/D converter together with the A/D conversion circuit 6 and the control circuit 7.

Each of the switches S10 and S11 selects either one of the threshold voltages Vrefp, Vrefm and the conversion subject voltage Vsl and applies a selected voltage to the capacitors CS10 and CS11. A setting of the switches S10 and S11 for selection of the conversion subject voltage Vsl is referred to as a sampling setting. A setting of the switches S10 and S11 for selection of either one of the threshold voltages Vrefp and Vrefm is referred to as a MD/A conversion setting.

The capacitors CS10 and CS11 have the same capacitance CS. One ends of the capacitors CS10 and CS11 are connected in common and connected to the inverting input terminal of the operational amplifier 2 through the switch S12 and connected to the ground line through the switch S13. A voltage selected by the switch S10 is connected to the other end of the capacitor CS10. A voltage selected by the switch S11 is applied to the other end of the capacitor CS11.

The capacitor CF has a capacitance (=2×CS), which is twice as large as that of the capacitors CS10 and CS11. The capacitor CF is connected to receive the conversion subject voltage Vsl at its one end. The other end of the capacitor CF is connected to the inverting input terminal of the operational amplifier 2 through the switch S15 and to the ground line through the switch S16.

The switch S14 is interposed between the non-inverting input terminal and the output terminal of the operational amplifier 2. The switch S17 is interposed between the inverting input terminal of the operational amplifier 2 and the common junction of the capacitors C1 and C2.

The operational amplifier 2 operates as the level shift circuit under a state that the switches S12, S14 and S15 are set in the off-state and the switch S17 is set in the on-state. The operational amplifier 2 operates as the residual voltage generation circuit under a state that the switch S15 is set in the on-state and the switches S16 and S17 are set in the off-state. An operation mode of the operational amplifier 2 operating as the level shift circuit is referred to as a level shift mode. An operation mode of the operational amplifier 2 operating as the residual voltage generation circuit as well as the cyclic type A/D converter is referred to as an A/D conversion mode.

<Control Circuit>

The control circuit 7 generates control signals (not shown) for switching over settings of the switches SW0 to SW5 and S1 to S17, and switches over the operation mode of the voltage detection device 1 to either the level shift mode or the A/D conversion mode in accordance with a predetermined sequence. In the operation under the A/D conversion mode, the control circuit 7 executes processing for generating a final A/D conversion data Do based on plural digital conversion values XD, which are outputted sequentially from the A/D conversion circuit 6.

<Operation>

The processing executed by the control circuit 7 and the entire operation of the voltage detection device 1 will be described next.

In detecting the inter-terminal voltage of each battery cell B1 to B4 forming the assembled battery BT, the control circuit 7 sets the input switchover circuit 5 to the output side of the operational amplifier 2. In this stage, the processing of the level shift mode and the processing of the A/D conversion mode are executed alternately. At every completion of one cycle of execution of the processing in both operation modes, the battery cell, which is made to be the voltage detection subject, is switched over sequentially in the level shift mode. In the A/D conversion mode, the output voltage Vop of the operational amplifier 2 (that is, hold voltage of the capacitor C2), which is the result of processing in the level shift mode, is made to be an input to the cyclic type A/D converter.

On the other hand, in detecting the external voltage Vin inputted from the external input terminal T5, the input switchover circuit 5 is set to the external input terminal T5 side to execute only the A/D conversion mode. However, the input switchover circuit 5 is set to the output side of the operational amplifier 2 when the external voltage Vin is held by the residual voltage generation circuit.

(A) Level Shift Mode

Figure 2:
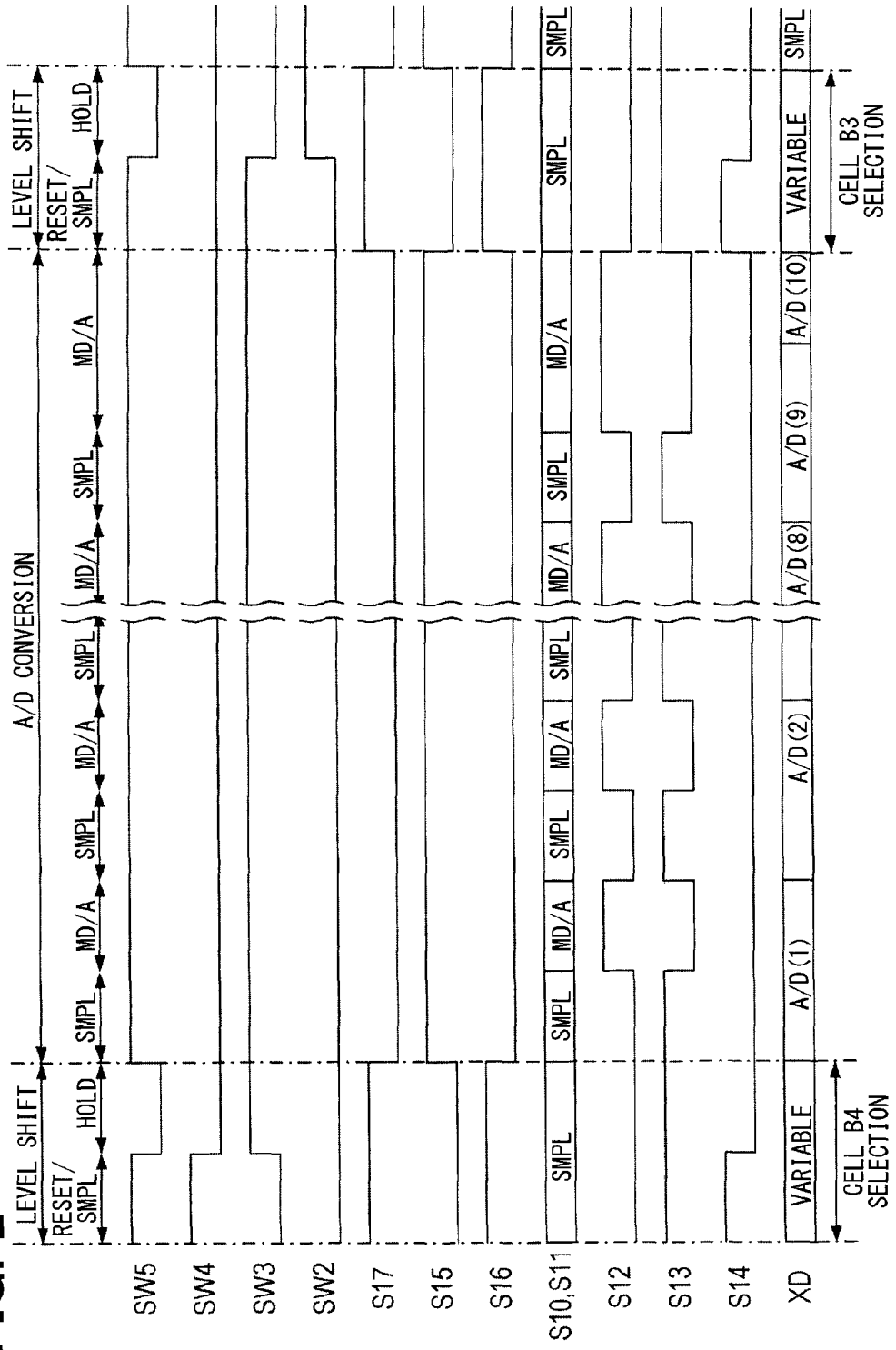
FIG. 2 is a timing chart showing an operation of the first embodiment.

As shown in FIG. 2, the level shift mode includes a reset/sampling period and a hold period. During all over the period of the level shift period, the control circuit 7 sets the switches S10 and S11 among the switches S10 to S17 forming the second part circuit 4 in the sampling setting, sets the switches S12 and S15 in the off-state and sets the switches S13, S16 and S17 in the on-state. Under this state, the settings of the switch S14 and the switches SW0 to SW5 forming the first part circuit 3 are switched over appropriately between the reset/sampling period and the hold period. With this switchover, the voltage representing the inter-terminal voltage of the selected one battery cell Bi is held in the capacitor C2 and outputted as the output voltage Vop of the operational amplifier 2.

Figure 3:
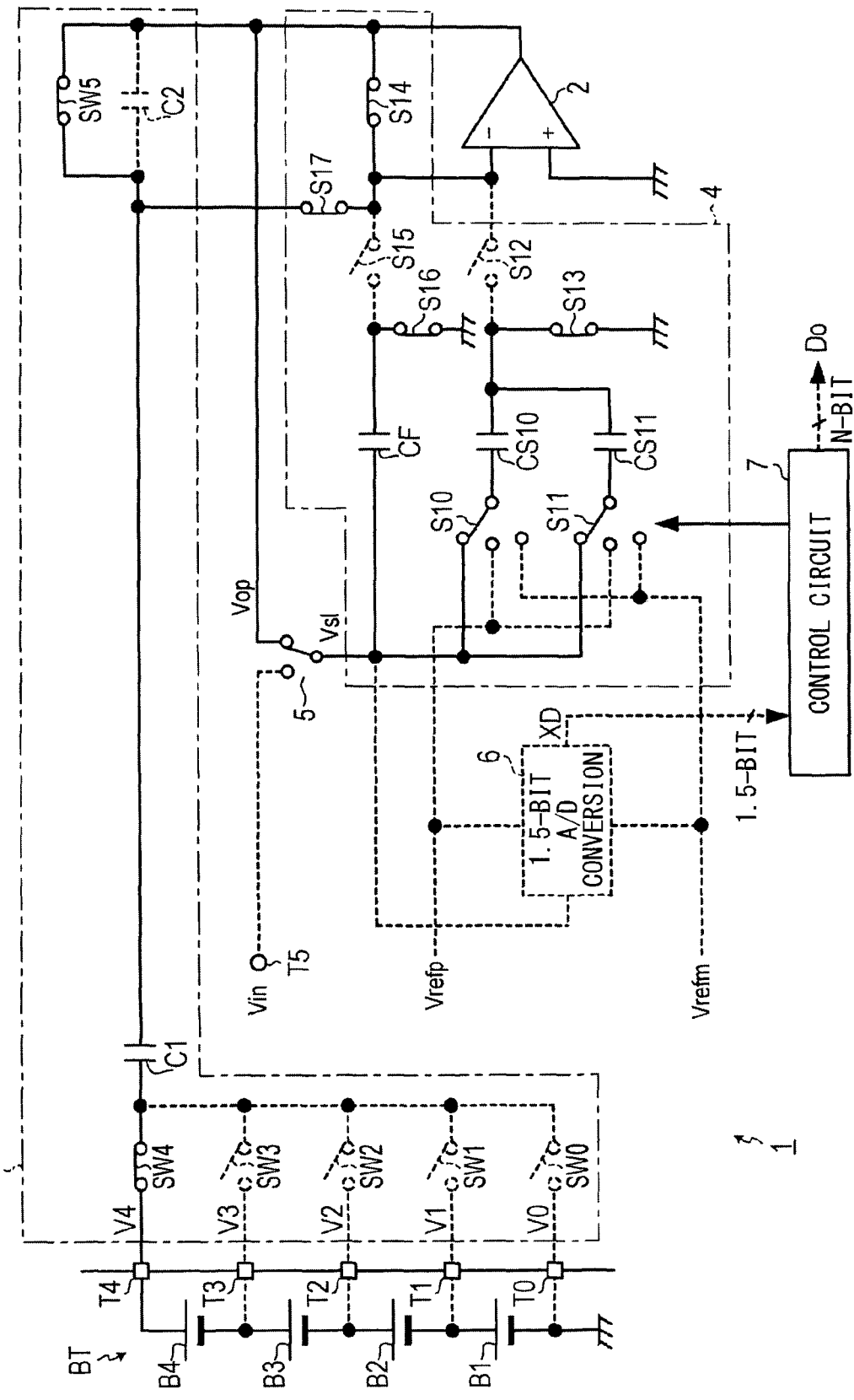
FIG. 3 is a circuit diagram showing a connection-state in a reset period in a level shift mode in the first embodiment.

In the reset/sampling period, among the switches SW0 to SW5 forming the first part circuit 3, the control circuit 7 sets the switch SWi (B4 in the figure) and the switch SWi (SW4 in the figure) connected to the positive polarity side of the battery cell Bi, which is the subject of measurement, in the on-state and sets the other switches (SW0 to SW3 in the figure) in the off-state. The control circuit 7 sets the switch S14 forming the second part circuit 4 in the on-state. The state of connection at this time is shown in FIG. 3. In FIG. 3, parts related to the operation are indicated with solid lines and parts not related to the operation are indicated with dotted lined. The same is true for FIG. 4 and FIG. 6.

That is, in the reset/sampling period, the positive-side voltage V4 of the battery cell B4 is applied to one end of the capacitor C1 through the switch SW4. The voltage of the inverting input terminal of the operational amplifier 2 is applied to the other end of the capacitor C1 through the switch S17. This voltage is the ground voltage, which is applied to the inverting input terminal assuming imaginary short. Thus the capacitor C1 stores a charge Qc1 (=C1×V4). The charge of each of the capacitors C2, CS10, CS11 and CF is reset (cleared to zero) when the ground voltage is applied to both ends of each capacitor.

Figure 4:
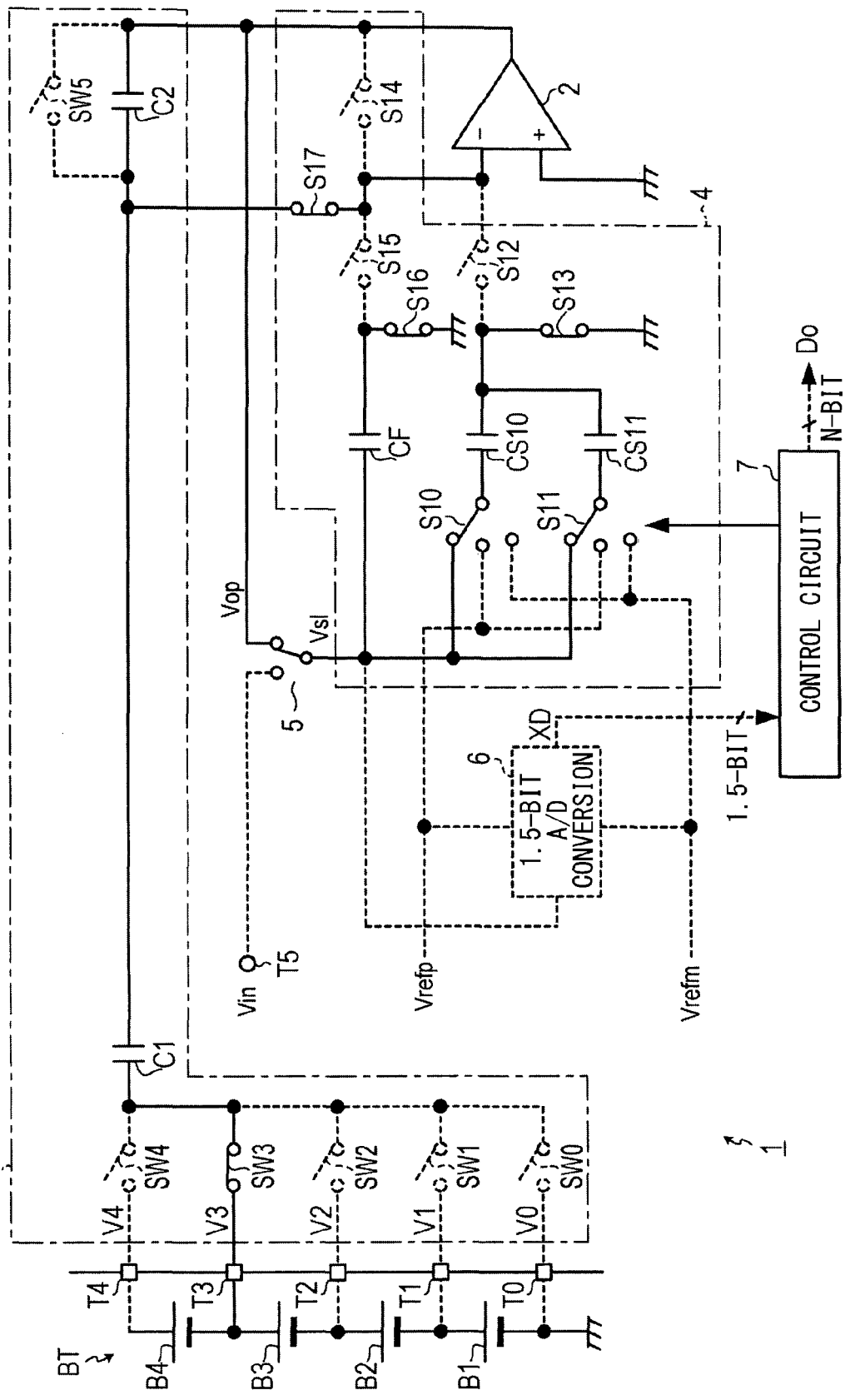
FIG. 4 is a circuit diagram showing a connection-state in a hold period in the level shift mode in the first embodiment.

Referring back to FIG. 2, in the hold period, the control circuit 7 switches over the switch SWi (SW4 in the figure) connected to the positive side of the battery cell Bi, which is the subject of measurement, in the off-state and switches over the switches SW5 and S14 in the off-state. This state of connection is shown in FIG. 4.

That is, the charges are redistributed between the capacitors C1 and C2 with the negative-side voltage V3 of the battery cell B4 being applied to the one end of the capacitor C1 through the switch SW3 in the hold period. Specifically, since the charge Qc1 of the capacitor C1 varies as Qc1=C1×V3, the capacitor C2 is charged with the same amount of charge as a change amount ΔQc1(=C1×(V4−V3)) of the charge Qc1 of the capacitor C1. As a result, the voltage of the capacitor C2, that is, the output voltage Vop of the operational amplifier 2 is expressed as the following equation (1). Since the capacitances C1 and C2 are known constants, the output voltage Vop of the level shift circuit corresponds to an amplification of the inter-terminal voltage of the battery cell B4, which is the subject of measurement, by C1/C2.

$$Vop=\Delta Qc1/C2=(V4-V3)\times C1/C2 \qquad (1)$$

This output voltage Vop is applied to the capacitors CS10, CS11 and CF through the input switchover circuit 5 and the switches S10 and S11. Since the ground voltage is applied to the other ends of the capacitors CS10, CS11 and CF through the switches S13 and S16, the capacitors CS10, CS11 and CF are set with the charge, which corresponds to the output voltage Vop of the level shift circuit, that is, the inter-terminal voltage (V4−V3) of the battery cell B4, which is the measurement subject. That is, the charges Qcs10 and Qcs11 stored in the capacitors CS10 and CS11 are expressed as the following equation (2). The charge Qcf stored in the capacitor CF is expressed as the following equation (3).

$$Qcs10=Qcs11=Cs\times Vop \qquad (2)$$

$$Qcf=Cf\times Vop=2Cs\times Vop \qquad (3)$$

(B) A/D Conversion Mode

Referring back to FIG. 2, the A/D conversion mode includes the sampling period and the MD/A period, which are repeated alternately. During all over the period of the A/D conversion period, the control circuit 7 sets the switches S14, S16 and S17 among the switches S10 to S17 forming the second part circuit 4 in the off-state, sets the switch S15 in the on-state and sets the switch S5 among the switches forming the first part circuit 3 in the on-state. Under this state, the settings of the switches S10, S11, S12 and S13 are switched over appropriately. With this switchover, the voltage set on the capacitor CF, that is, the output voltage Vop of the operational amplifier 2 is A/D-converted. The switches SW0 to SW4 in the A/D conversion mode may be set in arbitrary states. The switches SW0 to SW4 are assumed to be held in the same states as in the level shift mode. For this reason, at the time of switchover from the level shift mode to the A/D conversion mode, the settings of the switch SW5 and the switches S16, S16, S17 are switched over.

Figure 5:
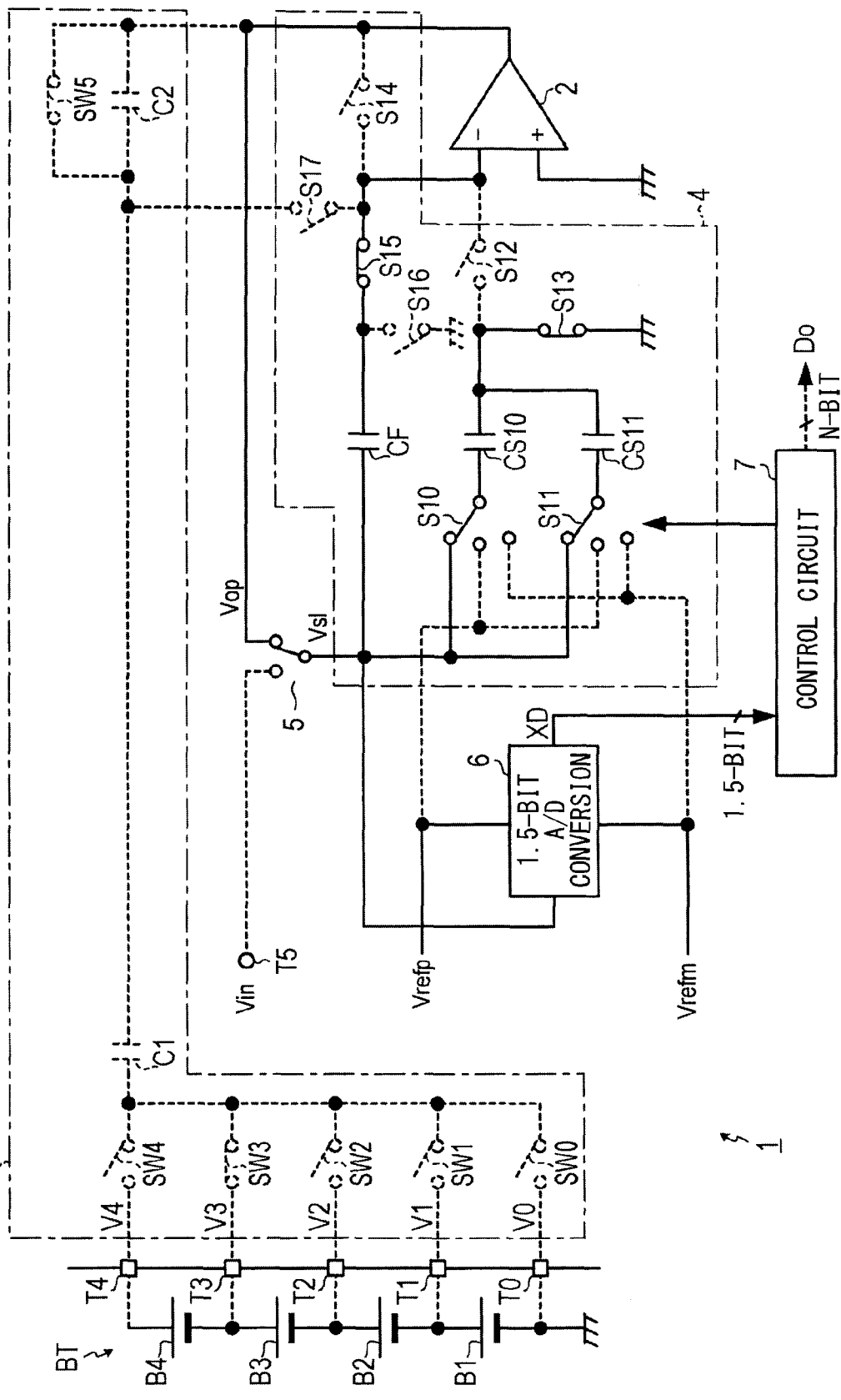
FIG. 5 is a circuit diagram showing a connection-state in a sampling period in an A/D conversion mode in the first embodiment.

In the sampling period, the control circuit 7 sets the switches S10 and S11 in the sampling setting, sets the switch S12 in the off-state and the switch S13 in the on-state as shown in FIG. 5.

That is, in the sampling period, the first part circuit 3 is disconnected from the operational amplifier 2 by the switch S17. Since the capacitor CF is interposed between the inverting input terminal and the output terminal of the operational amplifier 2, the inter-terminal voltage of the capacitor CF becomes equal to the output voltage Vop of the operational amplifier 2. With this output voltage Vop, the capacitors CS10 and CS11 are set with the same voltage as the capacitor CF. However, since the capacitor CF and the capacitors CS10, CS11 are set with the same voltage at the time immediately after the switchover from the shift mode to the A/D conversion mode, no particular change is caused. The A/D conversion circuit 6 generates the digital conversion value XD by converting the conversion subject voltage Vsl, which is the output voltage Vop of the operational amplifier 2, and outputs it to the control circuit 7.

Figure 6:
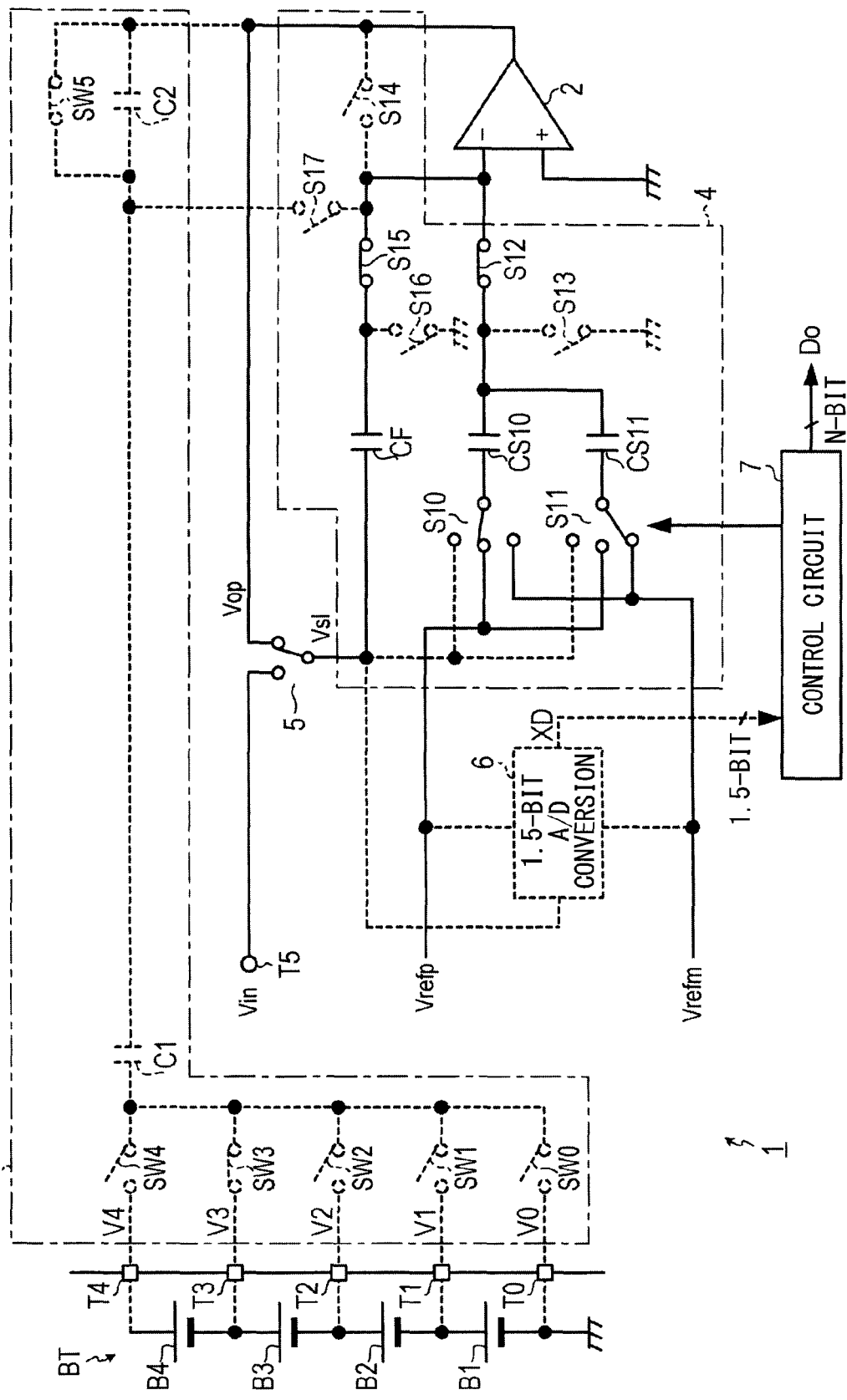
FIG. 6 is a circuit diagram showing a connection-state in a MD/A conversion period in the A/D conversion mode in the first embodiment.

In a multiplying MA/D period, the control circuit 7 sets the switch S12 in the on-state and sets the switch S13 in the off-state. The control circuit 7 sets the switches S10 and S11 in either of the reference voltages Vrem and Vrefp based on the digital conversion value XD acquired in the immediately preceding sampling period. This state of connection is shown in FIG. 6.

That is in the MA/D period, an integration circuit is formed by the operational amplifier 2 and other parts and the charges of the capacitors CS10, CS11 and CF are redistributed. Specifically, the following equation (4) holds assuming that the voltage set in the capacitors CS10, CS11 and CF in the sampling period is Vhold and the voltages selected by the switches S10 and S11 in accordance with the digital conversion value XD are Vref1 and Vref2, respectively. This equation is changed to the following equation (5) because of Cf=2×Cs.

$$(2Cs+Cf) \times Vhold = Cs \times (Vref1+Vref2) + Cf \times Vop \quad (4)$$

$$Vop = 2(Vhold - (Vref1+Vref2)/2) \quad (5)$$

Here, both Vref1 and Vref2 are set to Vrefm in case of XD=0. Either one of Vref1 and Vref2 is set to Vrem and the other of Vref1 and Vref2 is set to Vrefp in case of XD=1. Both Vref1 and Vref2 are set to Vrefp in case of XD=2.

By the redistribution of charges, the voltage (referred to as a residual voltage below) held by the capacitor CF, which is the output voltage Vop of the operational amplifier 2 becomes twice as large as a voltage, which results from subtraction of the d/a conversion voltage corresponding to the digital conversion value XD from the hold voltage Vhold. Thus, in the MD/A period, the operation of D/A conversion and the operation of amplifying (multiplying) the D/A conversion result by a factor of 2 are realized at the same time.

In the following sampling period, the residual voltage (=Vop) held by the capacitor CF in the MD/A period, is set in the capacitors CS10 and CS11 and the digital conversion value XD corresponding to the residual voltage is outputted from the A/D conversion circuit 6.

The above-described operation is repeated. Assuming that the number of digital conversion values required to generate a final A/D conversion data Do is N (N=10 in FIG. 2), (N−1) units of conversion data are provided by repeating (N−1) cycles and the capacitor CF is set with the residual voltage. Each of the cycles is a combination of the sampling period and the MD/A period. A K-th conversion data XD is produced by A/D conversion of the residual voltage by the A/D conversion circuit 6 without proceeding to the sampling period.

The control circuit 7 sequentially adds the K units of digital conversion values XD(1) to XD(N) by overlapping one bit, the A/D conversion data of N bits is finally calculated and outputted.

After the above-described operation, the operation of the shift level mode and the operation of the A/D conversion mode are repeated by sequentially switching over the battery Vi, which is the subject of measurement.

<Advantage>

As described above, the voltage detection device 1 operates the operational amplifier 2 as the level shift circuit and then as the residual voltage generation circuit (cyclic type A/D converter) by switching over the state of setting of the switches.

In the voltage detection device 1, the level shift circuit and the cyclic type A/D converter are formed to share one operational amplifier 2. Further, the operational amplifier 2 is shared by only adding the switches S15, S16 and S17 in comparison to the conventional level shift circuit and the cyclic type A/D converter. The voltage detection device 1 is thus effective to reduce its circuit area and power consumption.

The voltage detection device 1 can be used for many applications because it can A/D convert, as the conversion subject voltage, not only the inter-terminal voltage of the battery cell Bi acquired by the level shift circuit but also the external voltage Vin inputted from the external input terminal T5 by switching over the input switchover circuit 5.

Second Embodiment

A second embodiment will be described. However, only different parts will be described by omitting the description about the same configuration as the first embodiment.

<Configuration>

Figure 7:
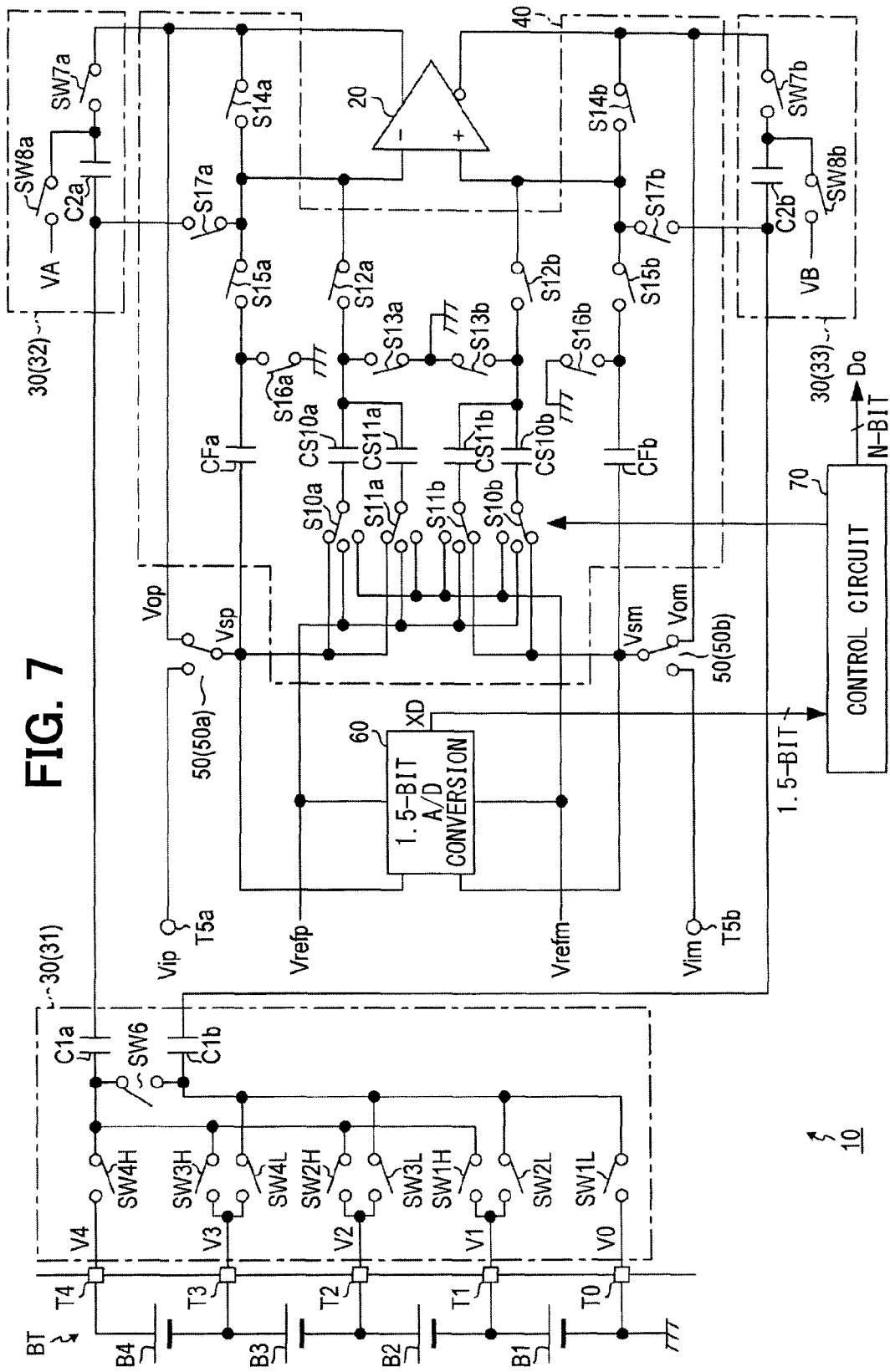
FIG. 7 is a circuit diagram of a voltage detection device according to a second embodiment.

A voltage detection device 10 is formed of, as shown in FIG. 7, an operational amplifier 20, a first part circuit 30, a second part circuit 40, an input switching circuit 50, an A/D conversion circuit 60 and a control circuit 70. The operational amplifier 20 is a differential output type, which has an inverting output terminal in addition to the normal output terminal (referred to as the non-inverting output terminal).

<First Part Circuit>

The first part circuit 30 forms the level shift circuit together with the operational amplifier 20 and includes a sampling part 31 and shift parts 32 and 33.

The sampling part 31 includes a pair of capacitors C1a and C1b (both having capacitances C1), switches SWiL and SWiH (i=1 to 4) and a switch SW6. One ends of the capacitors C1a and C1b are connected to each other through the switch SW6. The other end of the capacitor C1a is connected to the shift part 32 and the other end of the capacitor C1b is connected to the shift part 33. One ends of the switches SWiH are connected to the capacitor C1a and the other ends of the same are connected to the positive-side terminal Ti of the battery cell Bi. One ends of the switches SWiL are connected to the capacitor C1b and the other ends of the same are connected to the negative-side terminal Ti−1 of the battery cell Bi.

The shift part 32 includes a capacitor C2a (capacitance C2) and switches SW7a, SW8a. One end of the capacitor C2a is connected to the capacitor C1a and the other end of the same is connected to the non-inverting output terminal of the operational amplifier 20 through the switch SW7a. An end of the capacitor C2a, which is at the switch SW7a side, is configured to receive a reference voltage VA through the switch SW8a.

The shift part 33 includes a capacitor C2b (capacitance C2) and switches SW7b, SW8b. One end of the capacitor C2b is connected to the capacitor C1b and the other end of the same is connected to the inverting output terminal of the operational amplifier 20 through the switch SW7b. An end of the capacitor C2b, which is at the switch SW7b side, is configured to receive a reference voltage VB through the switch SW8b.

The shift parts 32 and 33 are provided to swing the output of the operational amplifier 20 within a range, in which a gain, a band and a band characteristic are maintained, relative to a common voltage set to an intermediate level between the power voltage and the ground voltage. Operations of the shift parts 32 and 33 as well as a method of setting the reference voltages VA and VB are disclosed in, for example, JP-B2-5152310 (US 2012/0139545 A1) and hence no detailed description is made.

<Second Part Circuit>

The second part circuit 40 is provided, for each of a combination of the inverting input terminal and the non-inverting output terminal of the operational amplifier 20 and a combination of the non-inverting input terminal and the inverting output terminal of the operational amplifier 20, with a similar circuit as the second part circuit 4, which is provided in the first embodiment. Circuit parts of the second part circuit 40 corresponding to the former combination and the latter combination are distinguished by addition of "a" and "b," respectively. An end of a switch S17a, which is at the first part circuit 30 side is connected to the common junction of the capacitors C1a and C2a. An end of a switch S17b, which is at the first part circuit 30 side is connected to the common junction of the capacitors C1b and C2b.

<Input Switching Circuit, A/D Conversion Circuit, Control Circuit>

The input switchover circuit 50 is formed of two switches 50a and 50b, which correspond to two outputs of the operational amplifier 20. The input switchover circuit 50 is configured to select one of a differential voltage (Vip−Vim) applied to the pair of external input terminals T5a and T5b, and a differential voltage (Vop−Vom) outputted from the operational amplifier 20.

The A/D conversion circuit 60 is configured to A/D-convert the differential voltage (Vsp−Vsm) applied through the input switchover circuit 50. The control circuit 70 generates control signals (not shown) for switching over settings of the switches of the first part circuit 30 and the second part circuit 40, and switches over the operation mode of the voltage detection device 10 to either the level shift mode or the A/D conversion mode in accordance with a predetermined sequence. In the operation under the A/D conversion mode, the control circuit 70 executes processing for generating a final A/D conversion data Do based on plural digital conversion values XD, which are outputted sequentially from the A/D conversion circuit 60.

<Operation>

The processing executed by the control circuit 70 and the entire operation of the voltage detection device 10 will be described next. The voltage detection device 10 differs from the voltage detection device 1 only in operation of the level shift mode and operates to perform the A/D conversion mode in the same way as the voltage detection device 1 except that two similar circuits are provided. For this reason, only the level shift mode will be described below.

Both switches SWiH and SWiL operate simultaneously and both switches Sja and Sjb also operate simultaneously. For this reason, the switches are designated as SWi and Sji for simplicity.

Figure 8:
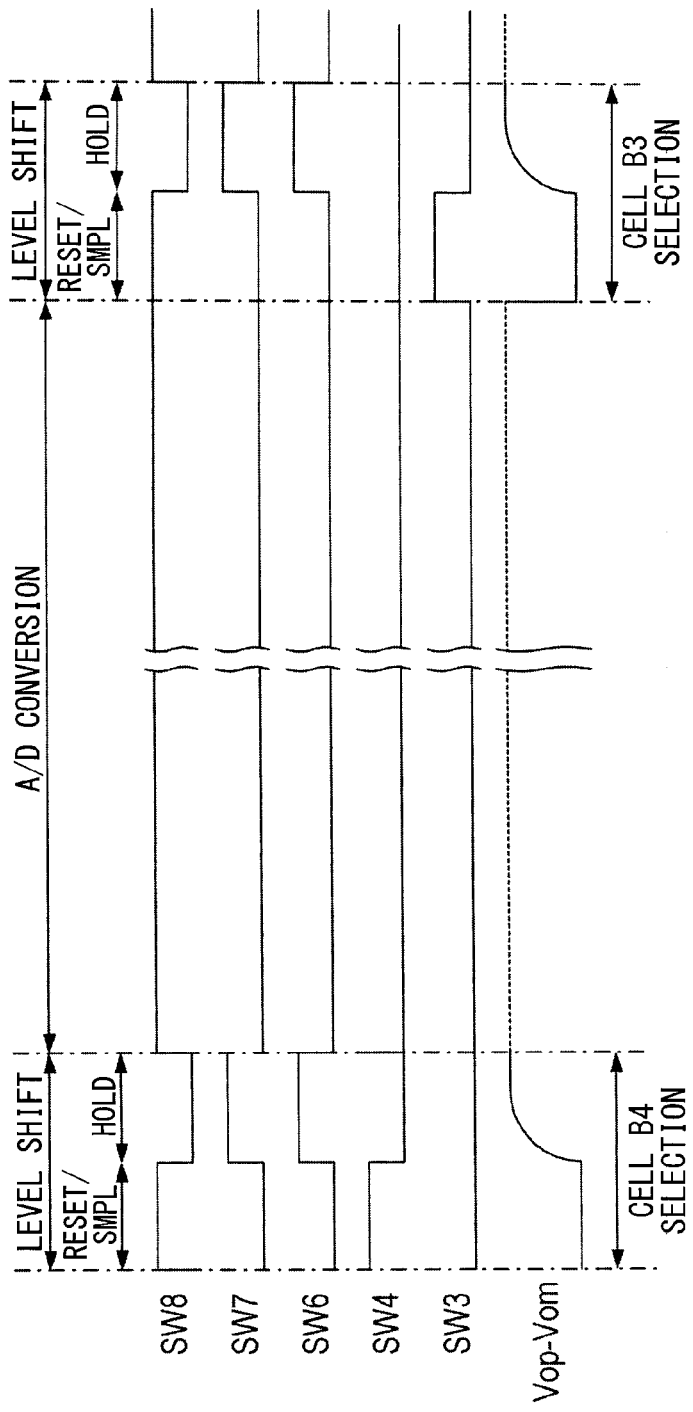
FIG. 8 is a timing chart showing an operation of the second embodiment.

As shown in FIG. 8, the level shift mode includes a reset/sampling period and a hold period. The switches S10 to S17 forming the second part circuit 40 are set in the same way as in the first embodiment. The control circuit 70 holds the differential voltage representing the inter-terminal voltage of the selected battery cell Bi by the capacitors C2a and C2b and outputs as the output voltage of the operational amplifier 20 by switching over the settings of the switches SW1 to SW4 and SW6 to SW8 forming the first part circuit 30.

In the sampling period, the control circuit 70 sets the switch SWi corresponding to the battery cell Bi (B4 in the figure), which is the subject of measurement, among the switches SW1 to SW4 forming the first part circuit 30, in the on-state and sets the other switches among the switches SW1 to SW4 in the off-state. The switches SW6 and SW7 are set in the off-state and the switch SW8 is set in the on-state.

That is, in the sampling period, each of one ends of the capacitors C1a, C1b, C2a and C2b connected to the inverting input terminal of the operational amplifier 20 is held at the same voltage by way of imaginary shorting of the operational amplifier 20. The positive-side voltage Vi of the battery cell Bi is applied to the other end of the capacitor C1a. The negative-side voltage Vi−1 of the battery cell Bi is applied to the other end of the capacitor C1b. The reference voltage VA of the capacitor C2a is applied to the other end of the capacitor C1a. The reference voltage VB is applied to the other end of the capacitor C2b. Thus the capacitors C1a, C1b, C2a and C2b store charges corresponding the applied voltages, respectively.

In the level shift period, the control circuit 70 sets the switches SW6 and SW7 in the on-state and sets the switches SW1 to SW4 and SW8 in the off-state. Thus electric charges are redistributed between the capacitors Ca1 and Ca2 and between the capacitors Cb1 and Cb1. As a result, the differential output Vop−Vom of the operational amplifier 20 is expressed as the following equation (6).

$$Vop-Vom = C1/C2(Vi-Vi-1) + (VA-VB) \quad (6)$$

The operation in the A/D conversion mode is the same as in the first embodiment.

<Advantage>

As described above, in addition to the advantage provided by the voltage detection device 1 of the first embodiment, the voltage detection device 10 can A/D-convert the differential voltage signal (Vip−Vim) applied from the level shift circuit having an offset or from the external input terminals T5a and T5b while maintaining an input dynamic range appropriately. Further, since the circuit is configured symmetrically, errors caused by common mode noise or feedthrough noise generated at the time of switchover of each switch circuit can be cancelled out and high conversion accuracy can be attained.

Further, since the voltages of both terminals of the battery cell Bi, which is the subject of measurement, are sampled at the same timing, the accuracy of voltage detection of each battery cell can be improved.

Third Embodiment

A third embodiment will be described. The third embodiment only differs from the second embodiment in configuration of a sampling part 31a of the first part circuit 30. For this reason, only different parts will be described by omitting the description about the same configuration as the second embodiment.

<Sampling Part>

Figure 9:
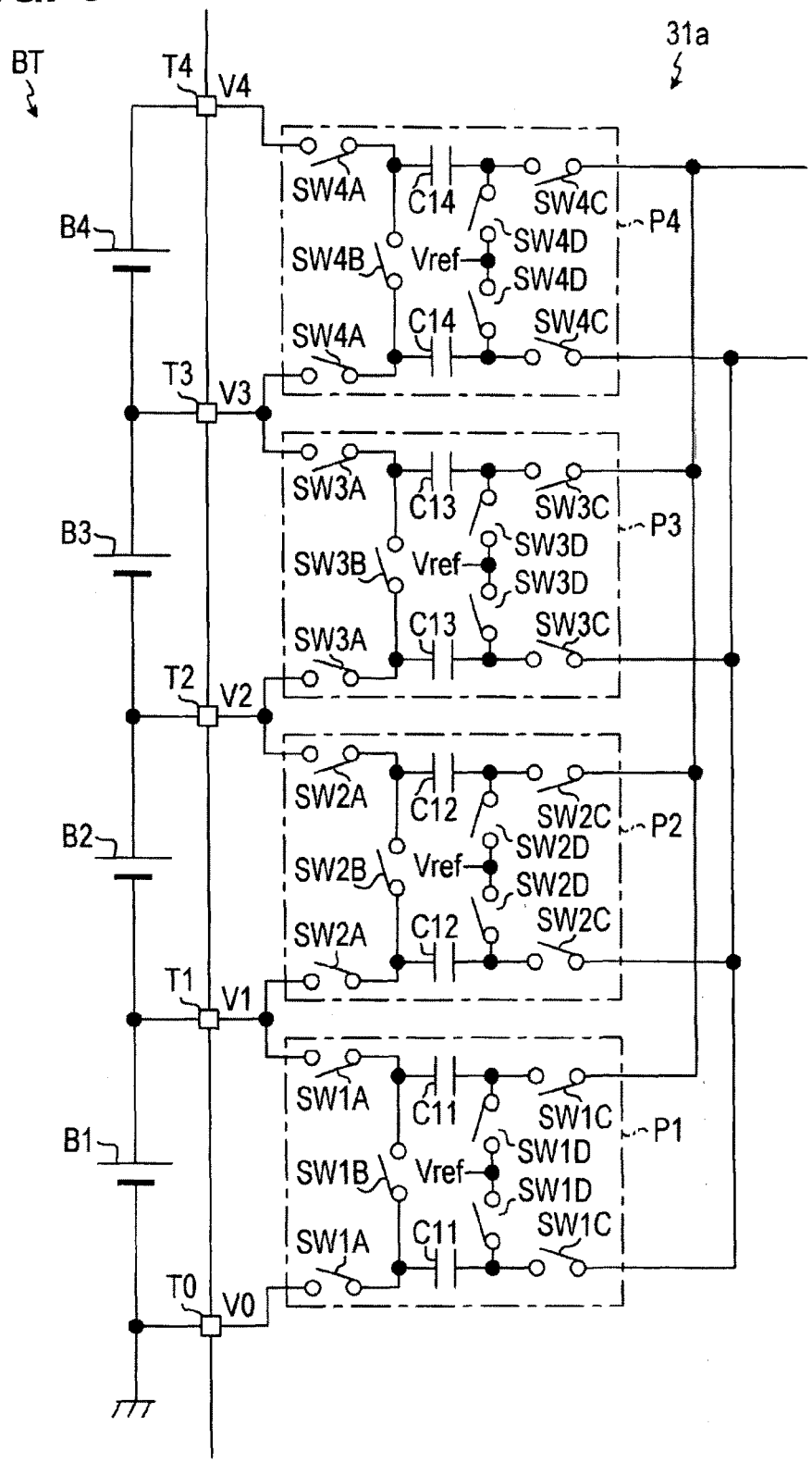
FIG. 9 is a circuit diagram of a second part circuit of a voltage detection device according to a third embodiment.

A sampling part 31a includes, as shown in FIG. 9, an individual circuit Pi having the same configuration between the terminals Ti and Ti−1, that is, each battery cell Bi. The individual circuit Pi is formed of a pair of capacitors C1i, C1i, a pair of switches SWiA, SWiA, a switch SWiB, a pair of switches SWiC, SWiC, and a pair of switches SWiD and SWiD. The switches SWiA and SWiA are provided between the terminals Ti and Ti−1 at one ends of the capacitors C1i and C1i. The switch SWiB is provided between the one ends of the capacitors C1i and C1i. The switches SWiC and SWiC are provided at the other terminals of the capacitors C1i and C1i. The switches SWiD and SWiD are provided between the reference voltage Vref and the other ends of the capacitors C1i and C1i. However, the capacitor C1i provided at the terminal Ti side is connected to the shift part 32 through the switch SWiD. The capacitor C1i provided at the terminal Ti−1 side is connected to the shift part 33 through the switch SWiD.

<Operation>

The voltage detection device having the sampling part 31a configured as described above operates differently from the second embodiment in the level shift mode.

Figure 10:
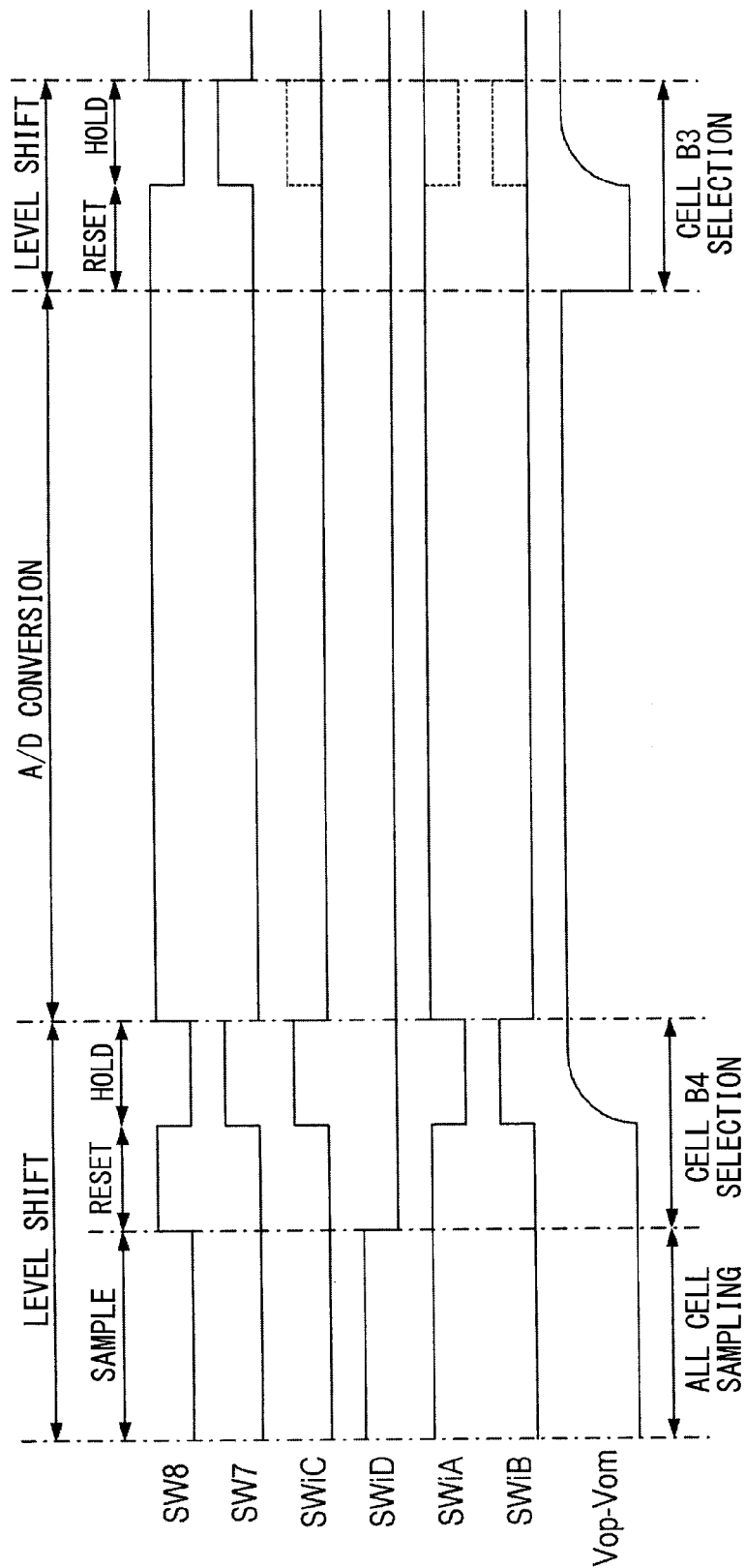
FIG. 10 is a timing chart showing an operation of the third embodiment.

As shown in FIG. 10, the level shift mode includes a sampling period, a reset period and a hold period. In the sampling period, the control circuit 70 sets the switches SWiA and SWiD in the on-state and the switches SWiB and SWiC in the off-state with respect to all individual circuits Pi. In this case, the control circuit 70 sets the switches SW7 and SW8 forming the shift parts 32 and 33 in the off-state.

Thus the voltages Vi and Vi−1 are applied to the one ends of the capacitors C1i and C1i. The reference voltage Vref is applied to the other ends. As a result, the capacitors C1i and C1i store charges corresponding to the applied voltages. That is, the voltages of both terminals of all battery cells B1 to B4 are sampled simultaneously.

The operations of the shift parts 32 and 33 in the subsequent reset period and the hold period are the same as the operations in the sample/reset period and the hold period in the second embodiment. Therefore, only the operation of the sampling part 31a will be described.

That is, in the reset period, the control circuit 70 sets the switches SWiA of all the individual circuits Pi in the off-state. Since the capacitor C1i is thus disconnected from the battery cell Bi, the state of the battery cell Bi at this time is held in the capacitors C1i and C1i. As described above in the second embodiment, the shift parts 32 and 33 and the second part circuit 40 are reset.

In the hold period, the control circuit 70 sets the switch SWiA in the off-state and the switches SWiB, SWiC in the on-state in each selected individual circuit Pi. With this operation, the operational amplifier 20 outputs the same output as that of the level shift circuit in the second embodiment.

In the subsequent A/D conversion mode, the switch SWiC is set in the off-state in one individual circuit Pi selected in the hold period. In executing the level shift mode again after executing the A/D conversion mode, the processing in the sampling period is omitted and the processing in the reset period and the hold period is executed. However, although the sampling is executed in the preceding sampling period, one individual circuit Pi is selected from individual circuits Pi, which are not yet the subject of hold processing, in the hold period. When the processing is finished for all of the individual circuits, the operation in the sampling period is executed again in the next level shift mode.

In FIG. 10, broken lines provided for the switches SWiA, SWiB and SWiC in the period of level shift mode, in which the battery cell B3 is selected, correspond to the operations of the switches SW3A, SW3B and SW3C.

<Advantage>

The third embodiment provides the similar advantages as the second embodiment. According to the third embodiment, the voltages at both terminals (ends) of all of the battery cells B1 to B4 can be sampled at the same time. It is possible to increase the accuracy of voltage detection of not only the individual battery cell Bi but also the entire assembled battery BT. It is thus possible to determine the characteristic of the assembled battery BT with high accuracy based on the voltage detection result.

Although all of the individual circuits P1 to P4 are operated in the sampling period in the third embodiment, only individual circuits Pi corresponding to one or plural battery cells Bi to be measured may be operated.

Other Embodiment

Voltage detection devices are described with reference to various embodiments. In those embodiments, the capacitor CF operates as an integration capacitor, the capacitor C2 operates as a hold capacitor, the switch S14 operates as a first control switch, the switches S12, S13 operate as a second control switch, the switches S10, S11 operate as a third control switch, the switch S17 operates as a first switchover switch, and the switches S15, S16 operate as a second switchover switch. The voltage detection devices are not limited to the disclosed embodiments but may be modified in various forms.

Figure 11:
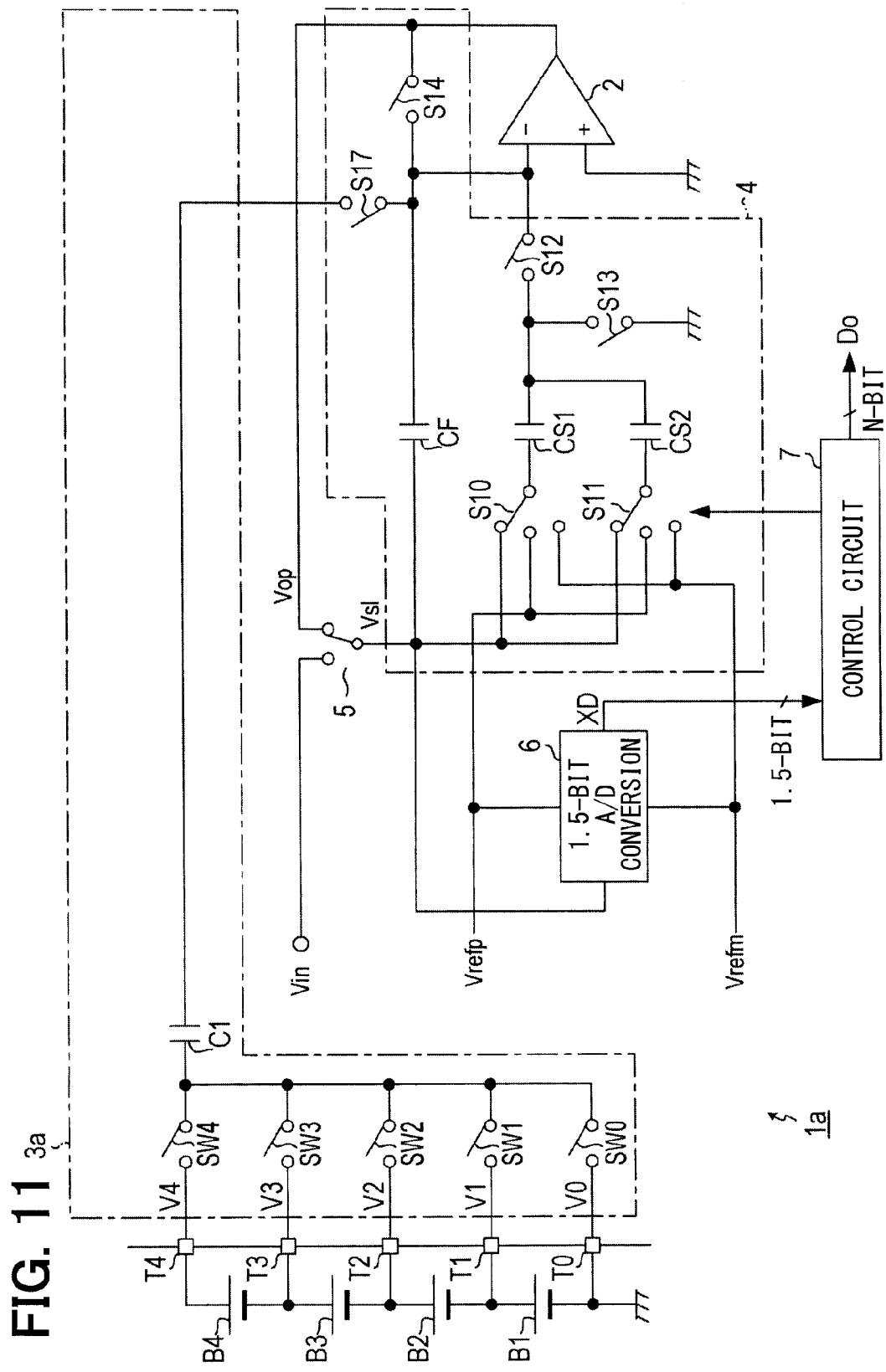
FIG. 11 is a circuit diagram of a voltage detection device according to a modification of the embodiments.

(1) In the first to the third embodiments, the capacitor C2 is provided for use in the level shift circuit and the capacitor CF is provided for use in the residual voltage generation circuit. However, the capacitor may be used in common by both circuits as the operational amplifier 2 is used in common. This modification is considered more specifically based on the first embodiment as one example. Like a voltage detection circuit 1a shown in FIG. 11, a first part circuit 3a is configured by removing the capacitor C2 and the switch SW5 from the first part circuit 3 and the control circuit 7 is configured to control each switch so that the capacitor CF and the switch S14 operate in place of the capacitor C2 and the switch SW5. In this case, the circuit configuration may be further reduced owing to reduction of component parts.

(2) In the first to the third embodiments, the 1.5-bit A/D converter is used as the A/D conversion circuits 6, 60. However, an A/D converter of plural bits may alternatively be used. In this case, in accordance with the number of bits of the digital conversion value XD, the number of capacitors, which form the capacitor array circuit, and switches, which apply the conversion subject voltage Vsl or the analog voltage corresponding to the digital conversion value XD to such capacitors, may be appropriately changed.

(3) Each structural element of the embodiments is only conceptual and not limited to the disclosed embodiments. For example, a function of one structural element may be divided into plural structural elements or functions of plural structural elements may be consolidated into one structural element. At least a part of the configuration of the embodiments may be replaced with a conventional configuration, which has the similar function. In addition at least a part of the configuration of the embodiments may be added to or exchanged with the other embodiments.

What is claimed is:

1. A voltage detection device for an assembled battery formed of battery cells connected in series, the voltage detection device comprising:
   an operational amplifier;
   a first part circuit forming, jointly with the operational amplifier, a level shift circuit, which selects either one of the battery cells of the assembled battery and extracts and holds a voltage representing an inter-terminal voltage of a selected battery cell;
   an A/D conversion circuit for converting an inputted conversion subject voltage to a digital value;
   a second part circuit forming, jointly with the operational amplifier, a residual voltage circuit, which generates a residual voltage by amplifying a differential voltage between the conversion subject voltage and an analog voltage corresponding to a conversion result of the A/D conversion circuit, and applies the residual voltage to the A/D conversion circuit as the conversion subject voltage;
   a switchover circuit for operating the operational amplifier as either one of the level shift circuit and the residual voltage generation circuit, and switching over a state of connection of the first part circuit and the second part circuit so that a voltage held by the level shift circuit is applied to the A/D conversion circuit and the residual voltage generation circuit as the conversion subject voltage; and
   a control circuit for controlling setting of the switchover circuit and operations of the first part circuit and the second part circuit so that an operation of a cyclic type A/D converter is performed, the control circuit operating the operational amplifier in a level shift mode to operate as the level shift circuit, the control circuit then operating the operational amplifier in an A/D conversion mode to operate as the residual voltage generation circuit, the control circuit circulating through the A/D conversion circuit and the residual voltage generation circuit the conversion subject voltage applied from the level shift circuit, wherein:
   the first part circuit includes a hold capacitor interposed between an input terminal and an output terminal of the operational amplifier for holding an extracted voltage;
   the second part circuit includes
      a capacitor array circuit formed of one or plural capacitors, one ends of which are connected in common,
      an integration capacitor interposed between the input terminal and the output terminal of the operational amplifier,
      a first control switch interposed between the input terminal and the output terminal of the operational amplifier to rest a charge of the integration capacitor,
      a second control switch interposed between a common junction of each capacitor of the capacitor array circuit and the input terminal of the operational amplifier, and connecting the common junction to either one of the input terminal of the operational amplifier and a reference line of a predetermined reference voltage, and
      a third control switch for applying an output voltage of the operational amplifier or an analog voltage corresponding to a conversion result of the A/D conversion circuit to an individual terminal, which is opposite to the common junction of the capacitor of the capacitor array circuit;
   the switchover circuit includes
      a first switchover switch interposed between the input terminal of the operational amplifier and the hold capacitor, and
      a second switchover switch interposed between the input terminal of the operational amplifier and the integration capacitor and connecting one end of the integration capacitor to either one of the input terminal of the operation amplifier and the reference line; and
   the control circuit sets the first switchover switch in an on-state and the second switchover switch to a reference line side thereby to operate the operational amplifier as the level shift circuit, and sets the first switchover switch in an off-state and the second switchover switch to an input terminal side of the operational amplifier thereby to operate the operational amplifier as the residual voltage generation circuit, and
   the first part circuit holds simultaneously the terminal voltages of the battery cells individually;
   the level shift circuit selects either one of the terminal voltages of the battery cells held by the first part circuit, and generates and holds a pair of voltages, which represents both terminal voltages as a differential voltage;
   the operational amplifier has an inverting output terminal and a non-inverting output terminal;
   the first part circuit and the switchover circuit has a part, which is connected to the inverting input terminal and the non-inverting output terminal of the operational amplifier and operates to convert one of the pair of voltages held by the level shift circuit as a first conversion subject voltage, and a part which is connected to the non-inverting input terminal and the inverting output terminal of the operational amplifier and operates to convert an other of the pair of voltages as a second conversion subject voltage; and
   the A/D conversion circuit A/D-converts the differential voltage between the first conversion subject voltage and the second conversion subject voltage.

2. The voltage detection device according to claim 1, wherein:
   the operational amplifier has an inverting input terminal and a non-inverting input terminal;
   the level shift circuit generates and holds a pair of voltages, which represents both terminal voltages of a selected battery cell as a differential voltage of the both terminal voltage;
   the first part circuit and the switchover circuit has a part, which is connected to the inverting input terminal and the non-inverting output terminal of the operational amplifier and operates to convert one of the pair of voltages held by the level shift circuit as a first conversion subject voltage, and a part which is connected to the non-inverting input terminal and the inverting output terminal of the operational amplifier and operates to convert an other of the pair of voltages as a second conversion subject voltage; and
   the A/D conversion circuit A/D-converts the differential voltage between the first conversion subject voltage and the second conversion subject voltage.

3. The voltage detection device according to claim 1, wherein:
the first part circuit includes:
first capacitors provided for each of the battery cells;
first switches interposed between both of a positive terminal and a negative terminal of each of the battery cells and one ends of the first capacitors, respectively;
a second switch interposed between the positive terminal and the negative terminal of each of the battery cells;
third switches interposed between the non-inverting terminal and the inverting terminal of the operational amplifier and other ends of the first capacitors, respectively; and
fourth switches interposed between the other ends of the first capacitor and a voltage line, to which a reference voltage is applied,
wherein the first switches and the fourth switches are turned on to charge the first capacitors with charges corresponding to the voltage of each of the battery cells, at least either one of the first switches and the fourth switches are turned off simultaneously to hold the charge in the first capacitors in respect to each of the battery cells, then the second switch and the third switches of the selected one of the battery cells, which is selected as a detection object, are tuned on to detect the voltage of the selected one of the battery cells.

4. The voltage detection device according to claim 1, wherein:
the first part circuit includes individual circuits of same configuration and connected to the battery cells, respectively, each of the individual circuits including a pair of capacitors and controlled by the control circuit to hold the terminal voltages of both terminals of each battery cell simultaneously.

5. A voltage detection device for an assembled battery formed of battery cells connected in series, the voltage detection device comprising:
an operational amplifier;
a first part circuit forming, jointly with the operational amplifier, a level shift circuit, which selects either one of the battery cells of the assembled battery and extracts and holds a voltage representing an inter-terminal voltage of a selected battery cell;
an A/D conversion circuit for converting an inputted conversion subject voltage to a digital value;
a second part circuit forming, jointly with the operational amplifier, a residual voltage circuit, which generates a residual voltage by amplifying a differential voltage between the conversion subject voltage and an analog voltage corresponding to a conversion result of the A/D conversion circuit, and applies the residual voltage to the A/D conversion circuit as the conversion subject voltage;
a switchover circuit for operating the operational amplifier as either one of the level shift circuit and the residual voltage generation circuit, and switching over a state of connection of the first part circuit and the second part circuit so that a voltage held by the level shift circuit is applied to the A/D conversion circuit and the residual voltage generation circuit as the conversion subject voltage; and
a control circuit for controlling setting of the switchover circuit and operations of the first part circuit and the second part circuit so that an operation of a cyclic type A/D converter is performed, the control circuit operating the operational amplifier in a level shift mode to operate as the level shift circuit, the control circuit then operating the operational amplifier in an A/D conversion mode to operate as the residual voltage generation circuit, the control circuit circulating through the A/D conversion circuit and the residual voltage generation circuit the conversion subject voltage applied from the level shift circuit, wherein:
the second part circuit includes
a capacitor array circuit formed of one or plural capacitors, one ends of which are connected in common,
an integration capacitor interposed between the input terminal and the output terminal of the operational amplifier,
a first control switch interposed between the input terminal and the output terminal of the operational amplifier to rest a charge of the integration capacitor,
a second control switch interposed between a common junction of each capacitor of the capacitor array circuit and the input terminal of the operational amplifier, and connecting the common junction to either one of the input terminal of the operational amplifier and a reference line of a predetermined reference voltage, and
a third control switch for applying an output voltage of the operational amplifier or an analog voltage corresponding to a conversion result of the A/D conversion circuit to an individual terminal, which is opposite to the common junction of the capacitor of the capacitor array circuit;
the level shift circuit uses the integration capacitor as the hold capacitor for holding the extracted voltage; and
the switchover circuit includes a first switchover switch interposed between the input terminal of the operational amplifier and the hold capacitor, and
the first part circuit holds simultaneously the terminal voltages of the battery cells individually;
the level shift circuit selects either one of the terminal voltages of the battery cells held by the first part circuit, and generates and holds a pair of voltages, which represents both terminal voltages as a differential voltage;
the operational amplifier has an inverting output terminal and a non-inverting output terminal;
the first part circuit and the switchover circuit has a part, which is connected to the inverting input terminal and the non-inverting output terminal of the operational amplifier and operates to convert one of the pair of voltages held by the level shift circuit as a first conversion subject voltage, and a part which is connected to the non-inverting input terminal and the inverting output terminal of the operational amplifier and operates to convert an other of the pair of voltages as a second conversion subject voltage; and
the A/D conversion circuit A/D-converts the differential voltage between the first conversion subject voltage and the second conversion subject voltage.

6. The voltage detection device according to claim 5, wherein:
the operational amplifier has an inverting input terminal and a non-inverting input terminal;
the level shift circuit generates and holds a pair of voltages, which represents both terminal voltages of a selected battery cell as a differential voltage of the both terminal voltage;
the first part circuit and the switchover circuit has a part, which is connected to the inverting input terminal and the non-inverting output terminal of the operational amplifier and operates to convert one of the pair of voltages held by the level shift circuit as a first conversion subject voltage, and a part which is connected to the non-inverting input terminal and the inverting output terminal of the operational amplifier and operates to convert an other of the pair of voltages as a second conversion subject voltage; and the A/D conversion circuit A/D-converts the differential voltage between the first conversion subject voltage and the second conversion subject voltage.

7. The voltage detection device according to claim 5, wherein:

the first part circuit includes:

first capacitors provided for each of the battery cells;

first switches interposed between both of a positive terminal and a negative terminal of each of the battery cells and one ends of the first capacitors, respectively;

a second switch interposed between the positive terminal and the negative terminal of each of the battery cells;

third switches interposed between the non-inverting terminal and the inverting terminal of the operational amplifier and other ends of the first capacitors, respectively; and fourth switches interposed between the other ends of the first capacitor and a voltage line, to which a reference voltage is applied, wherein the first switches and the fourth switches are turned on to charge the first capacitors with charges corresponding to the voltage of each of the battery cells, at least either one of the first switches and the fourth switches are turned off simultaneously to hold the charge in the first capacitors in respect to each of the battery cells, then the second switch and the third switches of the selected one of the battery cells, which is selected as a detection object, are tuned on to detect the voltage of the selected one of the battery cells.

8. The voltage detection device according to claim 5, wherein:

the first part circuit includes individual circuits of same configuration and connected to the battery cells, respectively, each of the individual circuits including a pair of capacitors and controlled by the control circuit to hold the terminal voltages of both terminals of each battery cell simultaneously.

* * * * *